(12) United States Patent
Stokowski

(10) Patent No.: US 7,564,545 B2
(45) Date of Patent: Jul. 21, 2009

(54) INSPECTION METHODS AND SYSTEMS FOR LITHOGRAPHIC MASKS

(75) Inventor: Stanley E. Stokowski, Danville, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 336 days.

(21) Appl. No.: 11/724,905

(22) Filed: Mar. 15, 2007

(65) Prior Publication Data

US 2008/0226157 A1    Sep. 18, 2008

(51) Int. Cl.
*G06K 9/00* (2006.01)
(52) U.S. Cl. .................................. 356/237.5; 382/144
(58) Field of Classification Search .... 356/237.2–237.6
See application file for complete search history.

(56) References Cited

U.S. PATENT DOCUMENTS

| | | | |
|---|---|---|---|
| 6,268,093 | B1 | 7/2001 | Kenan et al. |
| 6,646,281 | B1 | 11/2003 | Krantz et al. |
| 6,674,522 | B2 | 1/2004 | Krantz et al. |
| 6,727,512 | B2 | 4/2004 | Stowoski et al. |
| 6,885,442 | B1 | 4/2005 | Nugent et al. |
| 7,039,553 | B2 | 5/2006 | Nugent et al. |
| 7,072,502 | B2 | 7/2006 | Hemar et al. |
| 7,123,356 | B1 | 10/2006 | Stowoski et al. |
| 7,379,175 | B1 | 5/2008 | Stowoski et al. |
| 2002/0041653 | A1 | 4/2002 | Wilkins et al. |
| 2002/0062206 | A1* | 5/2002 | Liebchen ....................... 703/6 |
| 2004/0009416 | A1 | 1/2004 | Peterson et al. |
| 2004/0091142 | A1* | 5/2004 | Peterson et al. ............. 382/144 |
| 2005/0062957 | A1* | 3/2005 | Nugent et al. ............... 356/121 |
| 2005/0142455 | A1 | 6/2005 | Ando |
| 2006/0175528 | A1 | 8/2006 | Greenaway et al. |
| 2006/0236294 | A1 | 10/2006 | Saidin et al. |
| 2008/0170773 | A1 | 7/2008 | Wihl et al. |

OTHER PUBLICATIONS

Alieva et al., "Signal Reconstruction From Two Close Fractional Fourier Power Spectra.", IEEE Trans. Signal Processing, vol. 51, No. 1, pp. 112-123, (2003).
Gopinathan et al., "Noninterferometric phase retrieval using a fractional Fourier system," J. Opt. Soc. Am. A/ vol. 25, pp. 108-115 (2008).

* cited by examiner

*Primary Examiner*—Gregory J Toatley, Jr.
*Assistant Examiner*—Rebecca C Slomski
(74) *Attorney, Agent, or Firm*—Weaver Austin Villeneuve & Sampson LLP

(57) ABSTRACT

Disclosed are apparatus and methods for finding lithographically significant defects on a reticle. In general, at least a pair of related intensity images of the reticle in question are obtained using an inspection apparatus. The intensity images are obtained such that each of the images experience different focus settings for the reticle so that there is a constant focus offset between the two focus values of the images. These images are then analyzed to obtain a transmission function of the reticle. This transmission function is then input into a model of the lithography system (e.g., a stepper, scanner, or other related photolithography system) to then produce an aerial image of the reticle pattern. The aerial image produced can then be input to a photoresist model to yield a "resist-modeled image" that corresponds to an image pattern to be printed onto the substrate using the reticle. This resist-modeled image can then be compared with a reference image to obtain defect information. In particular, due to the introduction of the lithography tool and photoresist model, this defect information pertains to lithographically significant defects.

23 Claims, 5 Drawing Sheets

INSPECTION METHODS AND SYSTEMS FOR LITHOGRAPHIC MASKS

BACKGROUND OF THE INVENTION

The invention described herein relates generally to semiconductor device fabrication utilizing lithographic masks. In particular, the invention relates to the detection of significant defects on lithographic masks Fabricating semiconductor devices such as logic and memory devices typically includes processing a substrate such as a semiconductor wafer using a number of semiconductor fabrication processes to form various features and multiple levels of the semiconductor devices. For example lithography is a semiconductor fabrication process that involves transferring a pattern from a mask to a resist arranged on a semiconductor wafer. Additional examples of semiconductor fabrication processes include, but are not limited to, chemical-mechanical polishing, etching, deposition, and ion implantation. Multiple semiconductor devices may be fabricated in an arrangement on a semiconductor wafer and then separated into individual semiconductor devices.

Lithography is typically one of the most important processes in integrated circuit manufacturing since this is the process in which features are patterned on the wafer. The pattern printed in a resist by lithography is then utilized as a masking layer to transfer the pattern to one or more layers on the wafer in subsequent processing steps. Therefore, the pattern that is formed on the wafer during lithography directly affects the features of the integrated circuits that are formed on the wafer. Consequently, defects that are formed on the wafer during lithography may be particularly problematic for the integrated circuit manufacturing process. One of the many ways in which defects may be formed on the patterned wafer during lithography is by transfer of defects that are present on the mask to the wafer. Therefore, detection and correction of defects on the mask such as unwanted particulate or other matter is performed rather stringently to prevent as many defects on the mask from being transferred to the wafer during lithography.

However, as the dimensions of integrated circuits decrease and the patterns being transferred from the mask to the wafer become more complex, defects or marginalities in the features formed on the mask become increasingly important. In particular, if the pattern is not correctly formed on the mask, such discrepancies increasingly produce defects on the wafer as the dimension of the pattern decrease and the complexity of the pattern increases. That is, marginalities in the mask pattern may cause problems in the pattern that is printed on the wafer. Therefore, significant efforts have been devoted to methods and systems that can be used to detect problems in the pattern on the mask or in the design that will cause problems on the wafer. These efforts are relatively complex and difficult due, at least in part, to the fact that not all discrepancies or marginalities in the pattern formed on the mask (as compared to the ideal pattern) will cause errors on the wafer that will adversely affect the integrated circuit. In other words, some error in the pattern formed on the mask may not produce defects on the wafer at all or may produce defects on the wafer that will not reduce the performance characteristics of the integrated circuit.

Accordingly, improved mechanisms for detecting defects on a mask that would cause problems or variations on the patterned wafer are needed.

SUMMARY OF THE INVENTION

Accordingly, apparatus and methods for finding lithographically significant defects on a reticle are provided. In general, at least a pair of related intensity images of the reticle in question are obtained using an inspection apparatus. The intensity images are obtained such that each of the images experience different focus settings for the reticle so that there is a constant focus offset between at least two focus values of the images. These images are then analyzed to obtain a transmission function of the reticle. This transmission function is then input into a model of the lithography system (e.g., a stepper, scanner, or other related photolithography system) to then produce an aerial image of the reticle pattern. The aerial image produced can then be input to a photoresist model to yield a "resist-modeled image" that corresponds to an image pattern to be printed onto the substrate using the reticle. This resist-modeled image can then be compared with a reference image to obtain defect information. In particular, due to the introduction of the lithography tool and photoresist model, this defect information pertains to lithographically significant defects.

In a specific embodiment, a method of method of determining lithographically significant reticle defects is disclosed. A reticle is inspected to find reticle defects. A mask transmission function is obtained for each reticle defect. The mask transmission function for each reticle defect is obtained from at least two images of each reticle defect. A substantially constant focus offset was maintained between the focus setting of the at least two images. The obtained mask transmission function is input for each reticle defect into simulation software and/or hardware to calculate a defect-affected pattern in the developed photo-resist of a wafer that would be fabricated with a lithographic tool using the reticle. It is determined whether there are any lithographically significant reticle defects based on the defect-affected pattern that was calculated for each reticle defect.

In a specific aspect, the substantially constant focus offset was maintained between the focus setting of the at least two images during acquisition of such at least two images. In certain aspects, this is done while the average focus between the two images varies. In a specific implementation, obtaining the mask transmission function for each defect includes (i) obtaining at least two test images of the each defect's area so that the test images have a constant focus offset between each other, (ii) obtaining at least two references images of another reticle area that corresponds to the each defect's area so that the reference images have a constant focus offset between each other, or calculating the at least two reference images having a constant focus offset from the database used to manufacture the reticle, (iii) taking the differences between each pair of test and reference images, corresponding to a substantially same focus position, to obtain two difference images (iv) subtracting these two difference images to obtain a differenced image, (v) summing these two difference images to obtain a summed image, (vi) analyzing these summed image and the differenced image to determine the real and imaginary components of the mask transmission function for each defect. In one aspect, the at least two test images consist of a pair of test images and the at least two reference images consist of a pair of reference images.

In another embodiment, the at least two images of each reticle defect are obtained from at least two detectors or sensors that are positioned so as to achieve the constant focus offset between the at least two images. In yet another embodiment, the at least two images of each reticle defect are obtained sequentially on two different areas of a same detector. In another implementation, the constant focus offset is achieved by (i) a focus setting, for a first image of the each reticle defect, of $+\Delta$ relative to an optimum focus and (ii) a focus setting, for a second image of the same each reticle defect, of $-\Delta$ relative to the optimum focus, wherein the optimum focus has a focus setting equal to 0. In another implementation, the constant focus offset is achieved by (i) a focus setting, for a first image of the each reticle defect, equal to an optimum focus and (ii) a focus setting, for a second image of the same each reticle defect, of $2\Delta$ relative to the optimum focus.

In one embodiment, the simulation software and/or hardware includes a lithographic tool model that calculates an aerial image that would be produced by a particular lithographic tool based on the mask transmission function and includes a photoresist model for then calculating the defect-affected pattern based on the aerial image. In another aspect, a lithographically significant reticle defect is defined as a reticle defect that is determined to be printable in a photoresist layer of the calculated the wafer and/or within an area of the photoresist layer that has a device density over a predetermined value based on the calculated defect-assisted pattern.

In an alternative embodiment, the invention pertains to an apparatus for determining lithographically significant reticle defects. The apparatus includes one or more processors and one or more memory, wherein at least one of the processors and memory are adapted for performing one or more of the above described techniques.

In another method embodiment, a reticle, which is configured to achieve lithographic transfer of a reticle pattern onto a substrate using a lithography system, wherein the reticle includes at least one defect area, is provided. The defect area of the reticle is illuminated. A first transmission intensity image of the illuminated defect area reticle is captured at a first focus setting. A second transmission intensity image of the illuminated defect area reticle is captured at a second focus setting. A constant focus offset is maintained between the first and second focus settings or such a constant focus offset is emulated by adjusting the captured first and second transmission images. The first and second transmission intensity images are processed together to recover and store a reticle transmission function for the defect area. In most cases, the imaginary part of reticle transmission function for the defect area convolved with a recovery kernel can be determined by:

$$[I_{Test}(x, y, z) - I_{Ref}(x, y, z)] - [I_{Test}(x, y, -z) - I_{Ref}(x, y, -z)] =$$

$$i2c_T \sum_{i=0}^{N} \lambda_i(z)\frac{1}{2} \left\{ \begin{matrix} W_i(-z)[D_I(x, y) \otimes E_i(x, y, z)] - \\ W_i(z)[D_I(x, y) \otimes E_i(x, y, -z)] \end{matrix} \right\} + \ldots i2a_T \sum_{i=0}^{N} \lambda_i(z)\frac{1}{2}$$

$$\left\{ \begin{matrix} [P(x, y) \otimes E_i(x, y, -z)] \cdot [D_I(x, y) \otimes E_i(x, y, z)] - \\ [P(x, y) \otimes E_i(x, y, z)] \cdot [D_I(x, y) \otimes E_i(x, y, -z)] \end{matrix} \right\} i \sum_{i=0}^{N} \lambda_i(z)$$

$$\frac{1}{2} \left\{ \begin{matrix} [D_R(x, y) \otimes E_i(x, y, -z)] \cdot [D_I(x, y) \otimes E_i(x, y, z)] - \\ [D_R(x, y) \otimes E_i(x, y, z)] \cdot [D_I(x, y) \otimes E_i(x, y, -z)] \end{matrix} \right\}$$

$$\{[I_{Test}(x, y, z) - I_{Ref}(x, y, z)] + [I_{Test}(x, y, z) - I_{Ref}(x, y, z)]\}/2 =$$

-continued $$\sum_{i=0}^{N} \lambda_i(z) \left\{ \begin{matrix} [D_R(x, y) \otimes E_i(x, y, -z)] \cdot [D_R(x, y) \otimes E_i(x, y, z)] + \\ [D_I(x, y) \otimes E_i(x, y, -z)] \cdot [D_I(x, y) \otimes E_i(x, y, z)] \end{matrix} \right\} +$$

$$\ldots 2c_T \sum_{i=0}^{N} \lambda_i(z)\frac{1}{2} \left\{ \begin{matrix} W_i(z)[D_R(x, y) \otimes E_i(x, y, -z)] + \\ W_i(-z)[D_R(x, y) \otimes E_i(x, y, z)] \end{matrix} \right\} +$$

$$\ldots 2a_T \sum_{i=0}^{N} \lambda_i(z)\frac{1}{2} \left\{ \begin{matrix} [P(x, y) \otimes E_i(x, y, -z)] \cdot [D_R(x, y) \otimes E_i(x, y, z)] + \\ [P(x, y) \otimes E_i(x, y, z)] \cdot [D_R(x, y) \otimes E_i(x, y, -z)] \end{matrix} \right\}$$

The defect transmission function can be convolved with relatively few Eigen vectors. Using de-convolution and iteration techniques, the mask transmittance function can be recovered to a good enough approximation to be used in a lithography simulator.

These and other features and advantages of the present invention will be presented in more detail in the following specification of the invention and the accompanying figures which illustrate by way of example the principles of the invention.

DETAILED DESCRIPTION OF SPECIFIC EMBODIMENTS

Figure 1A:
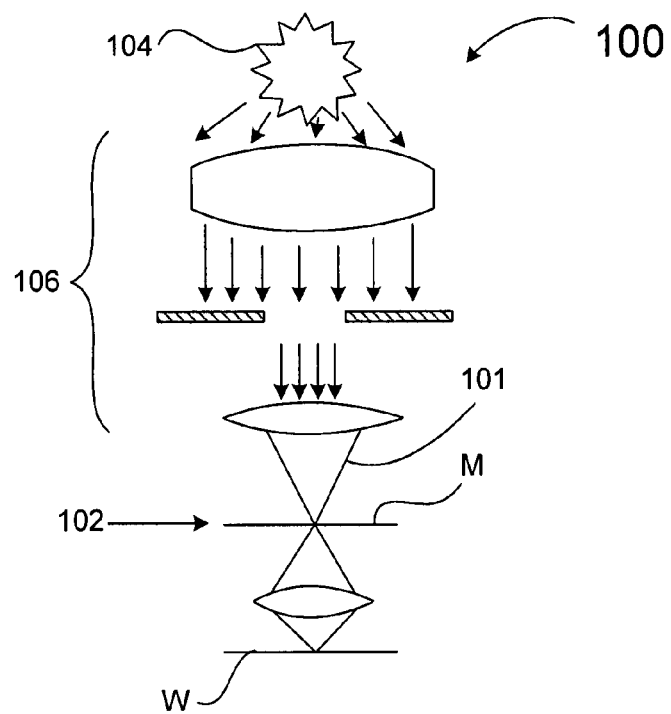
FIG. 1(a) is schematic depiction of a lithography apparatus, such a stepper or scanner, used to pattern a substrate or wafer.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

To push the resolution limits, advanced photolithography masks or reticles are designed using various Resolution Enhancement Techniques (RET). Optical Proximity Correction (OPC) is one such technique. With OPC the reticle patterns are modified in various ways to help ensure that the printed pattern has good agreement to the original desired pattern. These reticle pattern modifications can include perturbations to the size of main pattern features, the addition of serifs to pattern corners, and the addition of Sub-Resolution Assist Features (SRAFs). None of these pattern perturbations are expected to be printed onto the wafer. Instead these reticle modifications are expected to affect how other pattern portions print onto the wafer during the lithography process. Although these OPC features help to preserve the fidelity of the printed pattern, they cause the reticle patterns to be even more complex than they would otherwise be. The increased complexity of the reticle pattern and fact that not all pattern elements are expected to directly effect the printed pattern makes the task of inspecting the reticle for meaningful pattern defects much more difficult.

Several different reticle pattern inspection techniques will initially be described in general terms. Reticle inspection typically involves capturing high-resolution images of the mask pattern using either an optical or electron beam microscope and then comparing these images to reference images to look for defects. The reference images can be either acquired images of a second pattern on the reticle (die-to-die) or can be rendered from the design database (die-to-database). In either case differences between the images under test and the reference images are flagged as defects. Since these methods find defects by comparing high-resolution images of the reticle patterns, they can be characterized as mask plane inspection techniques. Although these techniques are effective at finding mask defects they are susceptible to detecting high numbers of "nuisance" defects. Nuisance defects are real defects in the mask pattern that have little or no impact on the fidelity of the printed pattern on the wafer. In the mask plane these nuisance defects may not be readily distinguished from other more serious defects.

One measure of a defect's importance is its MEEF or Mask Error Enhancement Factor. This factor relates the size and placement of the defect in the mask plane to the magnitude of the impact it will have on the printed image. High MEEF defects have high impact on the printed pattern; low MEEF defects have little or no impact on the printed pattern. An undersized main pattern feature in a dense fine-line portion of a pattern is an example of a defect with high MEEF, where a small mask plane sizing error could cause a complete collapse of the printed pattern. An isolated small pinhole is an example of a defect with low MEEF where the defect itself is too small to print and is distant enough from the nearest main pattern edge so as not to affect how that edge is printed. As these examples show the MEEF of a defect is a somewhat complicated function of the defect type and the pattern context in which the defect is located. Without knowing the MEEF the mask plane inspection techniques typically assume that all mask defects are important. At the same time these masks are so complex that they cannot be made free of all defects. Inspecting with enough sensitivity to find defects that may be important in high MEEF areas can lead to the detections of large numbers of similarly sized but unimportant defects in low MEEF areas. Time and energy can be wasted dispositioning these nuisance defects. Therefore, it would be advantageous to have a "MEEF aware" method that identifies lithographically significant defects while selectively screening out the nuisance defects in a timely manner.

One method of reticle inspection that attempts to be MEEF aware involves optically imaging the mask pattern using a microscope whose illumination and imaging conditions mimic those of the wafer stepper. It is reasoned that to the extent that the microscope emulates the stepper, the defects will experience the same MEEF at inspection time as they will at time of use. However this approach suffers from many limitations that impair the effectiveness of this approach. One limitation is the limited applicability of this method to "in-process" inspection of reticles. Some mask making sequences involve multiple process steps where the pattern is established in an early process step but the optical properties of the mask at that step are not those expected by the stepper. Because the unfinished mask does not behave like a finished mask in the inspection tool, the tool cannot properly take into account the MEEF of each defect. Also, this approach suffers from the limited flexibility with which the inspection microscope can be reconfigured. To precisely mimic a given stepper the microscope needs to precisely match the illumination and imaging conditions of that stepper. However, there are many stepper variations, each having a variety of possible configurations. Accordingly, it is difficult to build the required level of flexibility and precision into the inspection microscope of the inspection platform. Absent suitable emulation optics, the inspection tool cannot properly take into account the MEEF of each defect for different stepper configurations. Another limitation to the effectiveness of this approach concerns the difficulty in emulating the high-NA effects that occur at the wafer plane of a stepper. Known approaches sense the image at the emulated wafer plane using one or more image sensors. Practical sensors, however, have pixel sizes that are many tens of times larger than that that would be needed at the true wafer plane of a stepper. Correspondingly, the magnification of the inspection microscope must be tens of time higher than the magnification of the actual stepper emulated. However, with increased magnification comes substantially decreased NA. At a much lower NA, vector imaging effects and angle dependent resist film effects differ significantly from those that would be experienced at the true wafer plane. These differences limit the accuracy of the stepper emulation and again lead to poor accounting for the MEEF of the defects detected. Further limitations concern the general inadequacy of the reticle images acquired during inspection. These images may be inadequate in terms of resolution, contrast and/or signal-to-noise ratio and, thus, may be insufficient to enable adequate diagnosis of the nature of the defects on the mask.

A hybrid technique may be used to operate on a high-resolution image of the reticle to be inspected. From the image, an estimated mask pattern is then input to a software simulation of the lithographic process that simulates the stepper and the resist yielding a simulated wafer plane image. Defect detection is then performed on a simulated wafer plane. A serious shortcoming of such a hybrid technique involves the process by which a mask pattern is recovered from the high-resolution mask image. If the mask pattern (including defects) is known, than the high-resolution image of that pattern as seen by the inspection system optics can be determined by applying a proper partially coherent imaging model to the pattern. However, due to the non-linear aspects of such imaging models, it is difficult to work backwards from the sensed image to the corresponding pattern. In addition, the mask transmission function has an amplitude and a phase, or real and imaginary parts, but an intensity image is a complicated mixture of these parts. In order to obtain the real and imaginary parts of the mask transmittance function, at least two images are obtained under different conditions and then analyzed.

General Approach to Find Significant Reticle Defects:

In general, embodiments of the present invention avoid many of the mask pattern recovery problems of using the above described different processes to recover the mask information. In one implementation, a pair of related intensity images of the reticle in question are obtained using an inspection apparatus. The intensity images are obtained such that each of the images experience different focus settings for the reticle. That is, there is a constant focus offset between the two focus values of the images. These images are then analyzed to obtain a transmission function of the reticle. This transmission function is then input into a model of the lithography system (e.g., a stepper, scanner, or other related photolithography system) to then produce an aerial image of the reticle pattern. The aerial image produced can then be input to a photoresist model to yield a "resist-modeled image" that corresponds to an image pattern to be printed onto the substrate using the reticle. This resist-modeled image can then be compared with a reference image to obtain defect information. In particular, due to the introduction of the lithography tool and photoresist model, this defect information pertains to lithographically significant defects.

FIG. 1A provides a simplified schematic depiction of an existing lithographic pattern transfer apparatus 100 that can be used to transfer a mask pattern from a reticle M onto a wafer W. Typical tools include scanners and steppers. A typical example of such a tool is a PAS 5500 available from ASML of Veldhoven, the Netherlands. Other such machines are available from Nikon Technologies and Canon, Inc. of Japan as well as Ultratech of San Jose, Calif., just to name a few. In general, an illumination source 104 directs a light beam through illumination optics 106 onto a selected portion of a reticle M located in a mask plane 102. The illumination optics have a numeric aperture 101 at the reticle plane 102. (The terms mask and reticle are used herein interchangeably). The illumination beam is directed onto a selected location of the mask M to form a patterned optical signal that is directed through reduction optics and onto a wafer W (or other substrate that is coated with a photoimageable material (such as photoresist)) to effect pattern transfer.

Figure 1B:
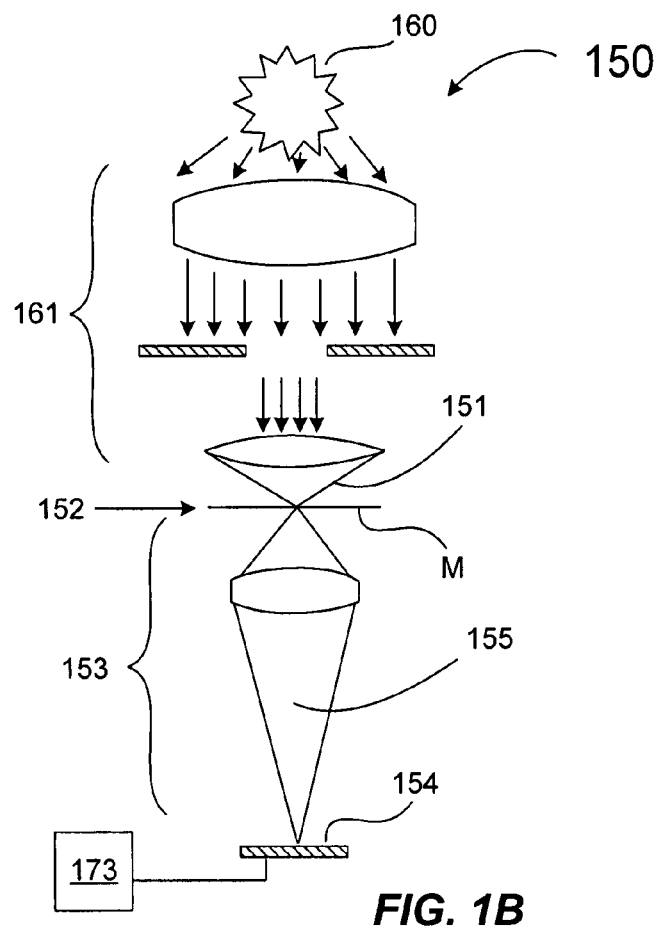
FIG. 1(b) is schematic depiction of a prior art inspection apparatus used to conduct mask inspection in accordance with the principles of the invention.

In contrast, the inspection apparatus 150 depicted in FIG. 1B has a high NA 151 at the reticle plane 152. The depicted inspection apparatus 150 includes microscopic magnification optics 153 designed to provide 60-350X magnification for enhanced inspection. The NA 151 at the reticle plane 152 of the inspection apparatus is considerable greater than the NA 101 at the reticle plane 102 of the lithography tool. For example, the NA 151 at the reticle plane 152 of the inspection apparatus can be at least 1.5× greater than the NA 101 at the reticle plane 102 of the lithography tool. Each of these optical systems (100, 150) induce different optical effects in the images produced. It is these different optical effects that embodiments of the present invention account for in the corrective processing disclosed herein.

An embodiment of the present invention can utilize standard inspection apparatus 150 such as described in simplified schematic representation of FIG. $1_B$. Such an embodiment uses an illumination source 160 that produces light that is directed through illumination optics 161 to produce a light beam that is directed onto and through a reticle M in the reticle plane 152. The light sources can be lasers or filtered lamps, but are not limited to such. In one example the source is a 193 nm laser. As explained above, the inspection apparatus 150 is configured with a NA at the reticle plane 151 that is higher than a reticle plane NA (e.g., 101) of an associated lithography tool. The reticle M to be inspected is placed at the reticle plane 152 and exposed to the source. The patterned image from the mask is directed through the microscopic magnification optical system (schematically depicted here as 153) which projects the patterned image 155 onto a sensor 154. Although not shown, a sensor is typically also positioned to collect a patterned image that is reflected from the mask.

Many different detectors can be employed by those having ordinary skill. Suitable detectors include CCD (charged coupled device) sensors, CCD arrays, TDI (time delay integration) sensors, TDI sensor arrays, PMT's, and many other sensors known to those having ordinary skill in the art In the depicted embodiment the detector 154 is a TDI array. The images captured by the sensor 154 can be processed by processing circuitry 173. The circuitry can form part of the inspection apparatus or can alternatively be located remotely from the inspection apparatus. Commonly, the circuitry includes microprocessors and associated memory which can be embodied in a computer suitable for enabling the principles described herein. One suitable implementation includes, but is not limited to the TeraScan series of DUV inspection tools available from KLA-Tencor of San Jose, Calif. The inventors expressly contemplate that many other inspection tools may be able to implement process embodiments of the present invention.

Figure 2:
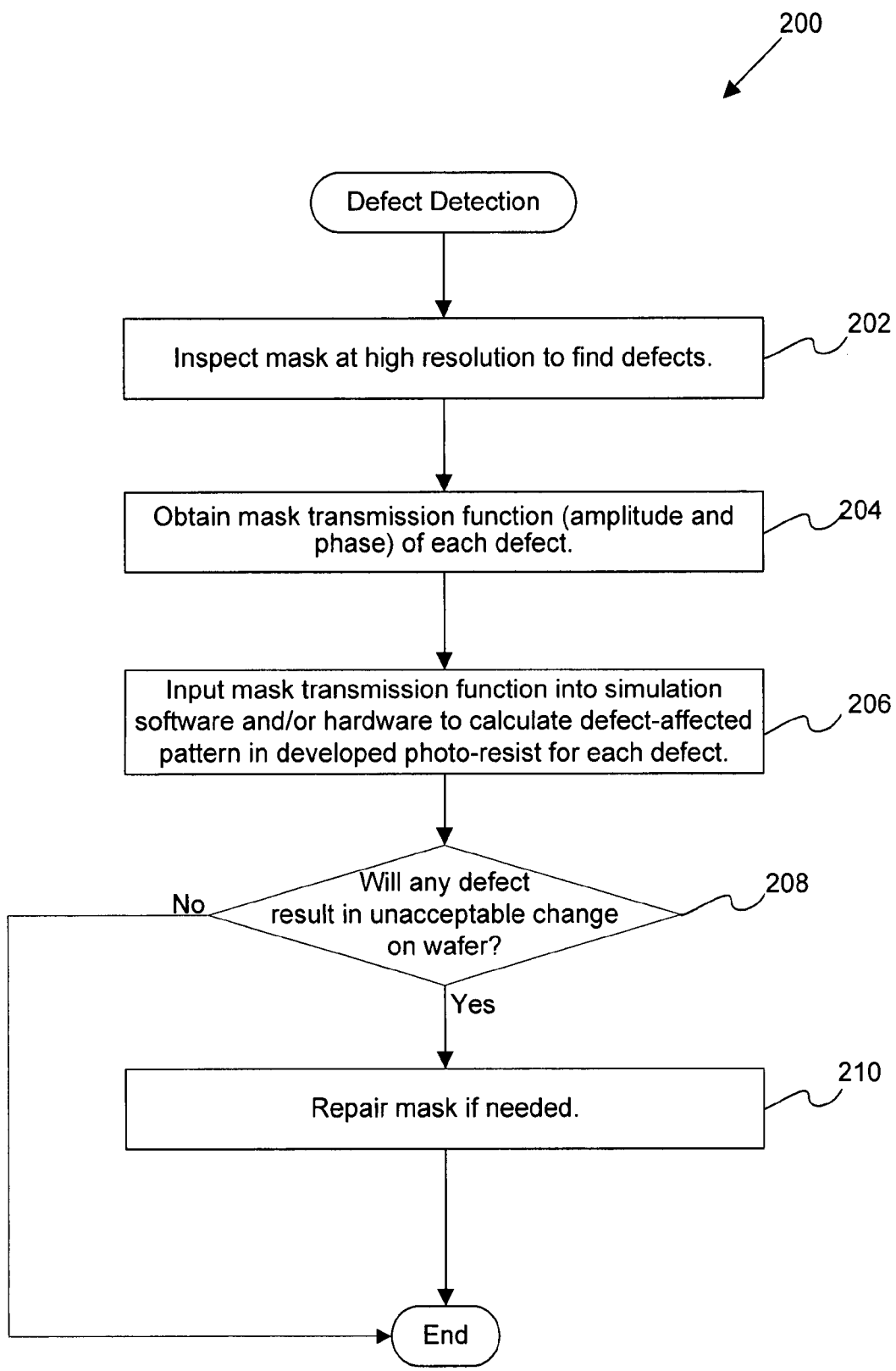
FIG. 2 is a flowchart illustrating a procedure for reticle defect detection in accordance with one embodiment of the present invention.

Techniques for Identifying Significant Reticle Defects:

The inventors have discovered a number of important relationships that have been formulated into several processes that can be used to identify lithographically significant defects on a reticle. A process embodiment of the present invention is described below in conjunction with the simplified flow diagram of FIG. 2. As shown, a mask is inspected at high resolution to find defects in operation 202. The transmission function (amplitude and phase) for each found defect is then obtained in operation 204. The mask transmission function is then input into simulation software and/or hardware to calculate a defect-affected pattern in the developed photoresist for each defect in operation 206. It may then be determined whether any defect would result in an unacceptable change on the wafer in operation 208. If the defect results in an unacceptable change the reticle can then be repaired if needed in operation 210. Otherwise, this operation is skipped. This procedure 200 may be repeated for any number of reticles and defects found during an inspection of such reticle.

Defects may be found in any suitable manner. For instance, an image obtained from a first area (e.g., first die) of the reticle is compared to an image obtained second area (e.g., second die) of the reticle that is designed to be identical to the first area. Alternatively, an image obtained from a first area of the reticle is compared to an image of the second area of the reticle that is calculated/rendered from the design database. In either comparison, a test image may be compared to a reference image to obtain a difference image. If the difference image is greater than a predetermined threshold, it is determined that the test image (or reference image) contains a defect. In embodiments described below, two test images, as well as two reference images, are obtained at a focus offset, and each pair of same focus test and reference images are subtracted to obtain two difference images. A defect may also be found by comparing each of the two difference images to a threshold value.

Figure 3:
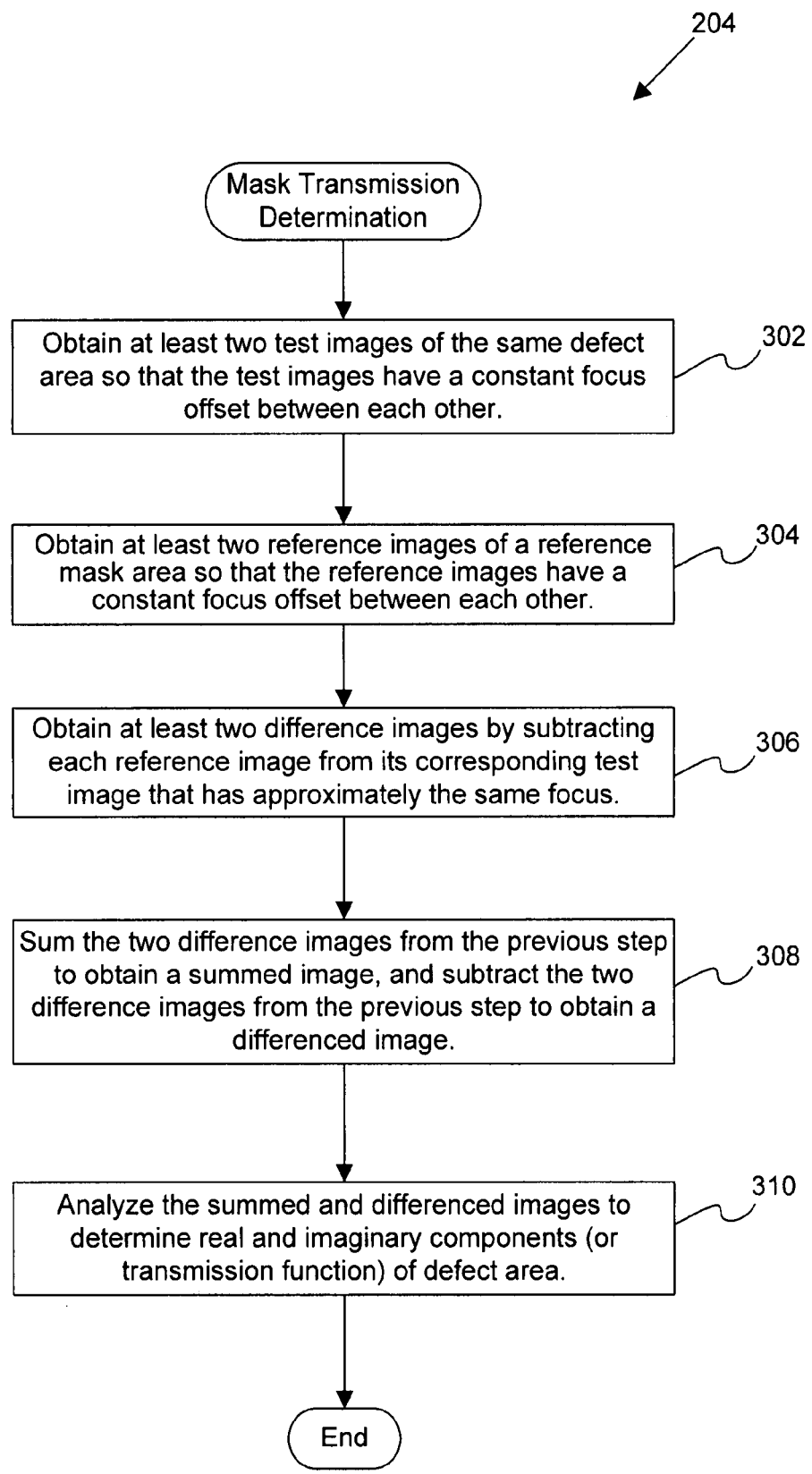
FIG. 3 is a flowchart illustrating the operation of FIG. 2 for determining a mask transmission function for a defect in accordance with one embodiment of the present invention.

Once defects are found (regardless of defect determination technique), the mask transmission function for each defect may be obtained in any suitable manner. FIG. 3 is a flowchart illustrating the operation 204 of FIG. 2 for mask transmission determination for a defect in accordance with one embodiment of the present invention. Initially, at least two test images of the same defect area are obtained so that the images have a constant focus offset between each other in operation 302. At least two reference images of a reference mask area are obtained (either by inspection (in the die-to-die mode) or by calculation (in the die-to-database mode)) so that the reference images have approximately a same focus offset between each other in operation 304. At least two difference images are obtained by subtracting each reference image from its corresponding test image of approximately the same focus in operations 306. These two difference images are summed to obtain a summed image, and the same two difference images are also subtracted to obtain a differenced image in operation 308. The summed and differenced images are then analyzed to determine real and imaginary components (or the transmission function) of the defect area in operation 310.

System Implementations:

The test and reference images may be obtained in any suitable manner so as to have constant focus offsets. One embodiment of the invention is to inspect a mask using two detectors (an imaging detector, such as a CCD or a TDI [time delay integration]) to obtain two images at two different focal positions relative to the mask. The two detector focal positions may be at a focal positions $\pm\Delta$ relative to best focus of the mask surface. The sum image of the two images may then be compared with a sum image from another die on the mask (die-to-die, D:D inspection) or to a calculated sum image from the database used to write the mask (die-to-database, D:DB inspection). Defects are detected in this inspection. The sum and difference images of these defects are then analyzed to determine the real and imaginary parts of the defect amplitude contrast. Subsequently this information is used in a lithography simulation to determine if the defect will result in an unacceptable change in the resulting photo-resist pattern on the wafer.

Figure 4:
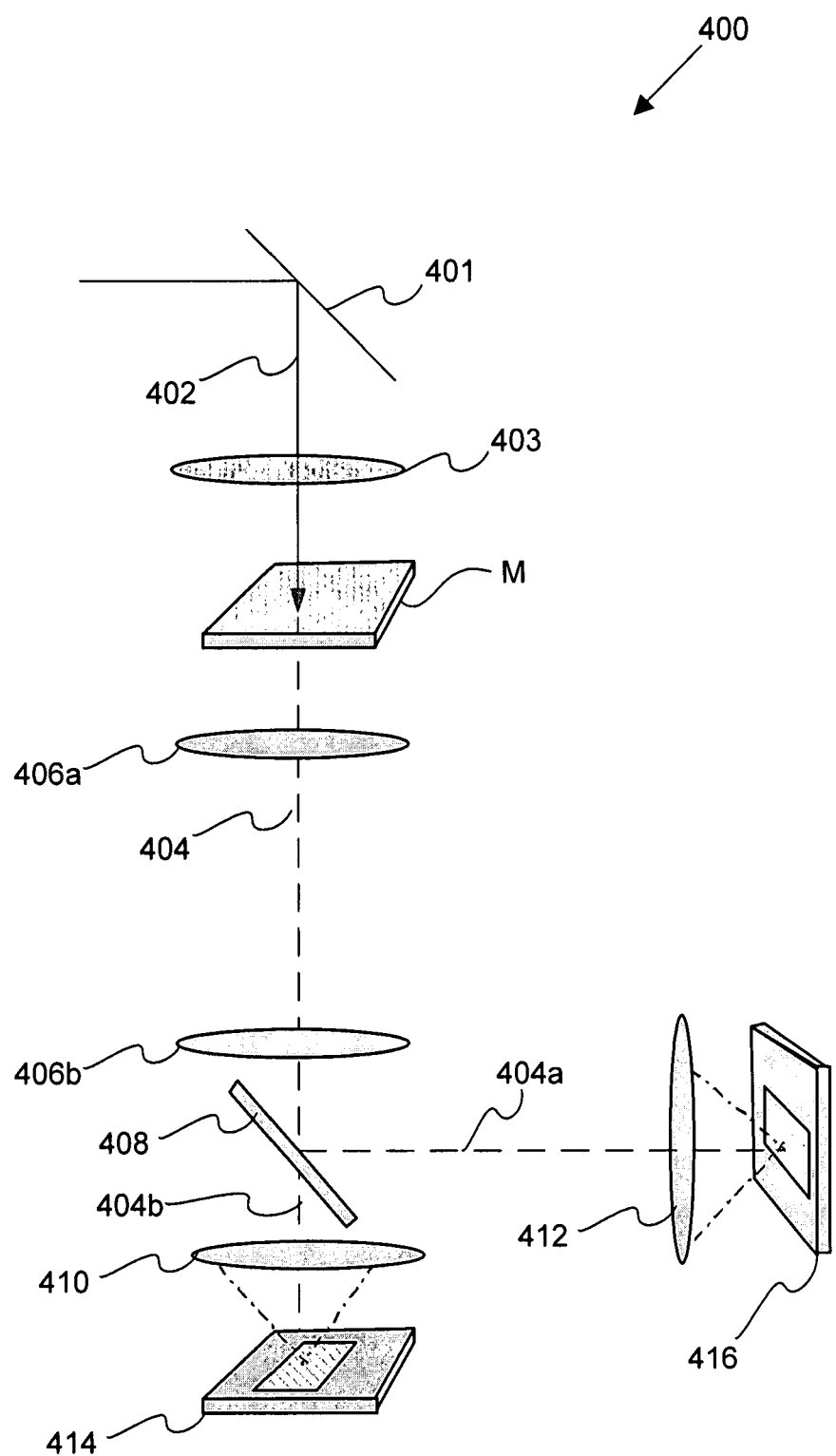
FIG. 4 is a diagrammatic representation of an inspection system having two detectors for receiving two images, respectively, of a reticle area at a constant focus offset in accordance with a first implementation of the presentation invention.

FIG. 4 is a diagrammatic representation of an inspection system 400 having two detectors for receiving two images, respectively, of a reticle area at a constant focus offset in accordance with a first implementation of the presentation invention. As shown, this inspection system 400 is arranged to generate an incident beam 402, reflected from mirror 401, through condenser lens that focuses the incident beam 402 onto an area of mask M. A portion of this incident beam 402 is transmitted through mask M as transmitted beam 404. The transmitted beam 404 is generally magnified and directed by optical elements 406a and 406b towards beam splitter 408. The optical element 406a may include any number of optical lenses and components for focus, magnifying and/or directing the transmitted beam towards splitter 408.

The splitter directs a first portion of the transmitted image 404a (e.g., 50%), through optical element 412, towards a first detector 416 and another portion of the transmitted image 404b (e.g., 50%), through optical element 410, towards a second detector 414. Optical elements 410 and 412 are generally structured to direct and refocus the transmitted beam portions to their respective detectors.

The first detector 416 is positioned with respect to the second detector so as to cause a focus offset between the two transmitted beam portions 404a and 404b. For instance, detector 416 may be positioned at a greater distance from splitter 408 than the detector 414. In one implementation, detector 414 is positioned at z=$-\Delta$ from optimum focus, z=0, while detector 416 is positioned at z=$+\Delta$ from optimum focus, z=0.

Figure 5:
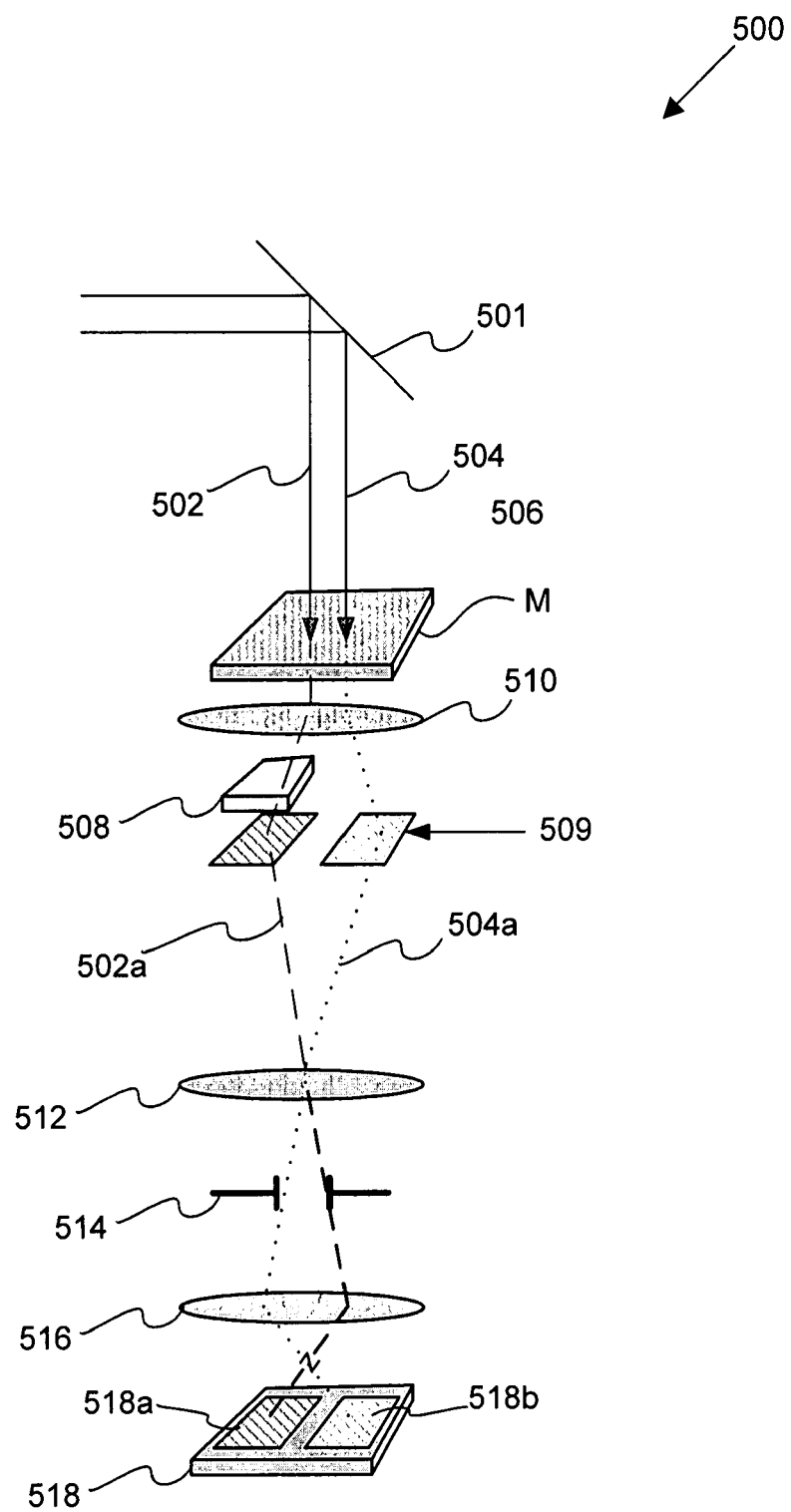
FIG. 5 is a diagrammatic representation of an inspection system having a single detector for receiving two images of two different fields of a reticle at a constant focus offset in accordance with a second implementation of the presentation invention.

Another embodiment of the invention is to inspect a mask by illuminating two adjacent fields at the mask object, offset-ting the focal position of one field relative to the other and detecting the two fields on a single detector. The same field is imaged at a first and second focal position by sequentially detecting the two fields on the single detector. FIG. 5 is a diagrammatic representation of an inspection system 500 having a single detector for receiving two images of two different fields of a reticle at a constant focus offset in accordance with a second implementation of the presentation invention. As shown, inspection system 500 is operable to generate two incident beams 502 and 504 (shown as reflected from mirror 501) that are directed towards two different area of mask M. Of course, the system may also be configured to generate more than two incident beams towards more than two different areas of the mask M.

Transmitted incident beam portion 502a is transmitted through a first area of the mask M, and transmitted incident beam portion 504a is transmitted through a second area of the mask M. Transmitted portion 502a also passes through a focus offset optics element 508, such as a glass or prism having a particular thickness, while the other transmitted portion does not pass through such focus offset element 508. Of course, both transmitted beams 502a and 504a may pass through any number and type of focus offset elements. The illustrated focus offset element 508 has a structure and size selected to cause a focus offset between the two transmitted portions 502a and 504a, e.g., at intermediate field plane 509 and at the detector 518. If multiple offset elements are utilized, then these offset elements would be sized and structured so as to achieve a constant focus offset between the two transmitted beams 502a and 504a. The transmitted portions 502a and 504a then are directed through elements 512 and 516 and aperture 514 onto a first area 518a and a second area 518b, respectively, of detector 518.

The incident beams are then moved relative to the mask M so that the first area is illuminated by the second incident beam. Thus, the first area of the mask M is illuminated and then imaged at a first focus onto the first area of the detector and later illuminated and then imaged at a second focus onto the second area of the detector. In order to sequentially detect the same area in a first detector area 518a and then a second detector area 518b, the detector preferably is a TDI (time delay integration) detector type.

In any of the embodiments described herein, the focus offset between the two transmitted incident beams can be any suitable value. In one implementation, the focus offset is $-\Delta$ for the first transmitted incident beam relative to an optimum focus and $+\Delta$ for the second transmitted incident beam relative to the optimum focus. In another implementation, one image is obtained at best focus and the other at $2\Delta$. Normal inspection in D:D or D:DB mode occurs with the best focus image to then determine defective regions. In defective regions, the best focus image and the defocused image are analyzed to determine the real and imaginary parts of defect amplitude contrast.

Regardless of the focus offset that is chosen, both images are compared in D:D and D:DB modes to find defects. Upon finding the defect, both images are analyzed to determine the real and imaginary parts of the defect amplitude contrast.

Detailed Theory:

It is known that partially coherent optical imaging can be modeled as a sum of coherent systems. In particular the Hopkins Equation for partially coherent imaging, which is known by those having ordinary skill in the art, can be used to form a TCC (Transmission-Cross-Correlation) matrix. This matrix can be decomposed into its Eigen vectors. Each Eigen vector then acts as the kernel of a coherent system. The Eigen value weighted sum of the intensity contributions from each of these coherent systems then yields the image intensity out.

Such equations are well known in the art and described in numerous publications. One such example is entitled "Sum of Coherent System Decomposition by SVD" by Nick Cobb dated Sep. 21, 1995, which is herein incorporated by reference in its entirety for all purposes. Using such equations, the intensity for the transmitted signal can be described. The intensity of the transmitted light image of the mask can be approximated as follows:

$$I_T(x, y, z) = \sum_{i=0}^{N} \lambda_i(z) \|[\{c_T + a_T \cdot P(x, y)\}] \otimes E_i(x, y, z)\|^2 \quad [\text{Eqn. 1}]$$

Where $I_T(x,y,z)$ describes the transmitted intensity image of a mask using the inspection system.

Wherein z is the distance from a best focus condition (z=0 being best focus).

Wherein $c_T$ is the complex transmitted amplitude of the background tone of the mask. For example, in a quartz and chrome binary mask $c_T$ can describe the properties of the chromium pattern.

Wherein $a_T$ is the complex transmitted amplitude of the difference between the mask foreground tone ($b_T$) and the background tone. For example, using the same mask as above $a_T = b_T - c_T$ can describe the optical properties of the difference between the quartz and the chromium. $c_T$ and $a_T$ of course vary depending on the properties of the material layers described.

Also $P(x,y)$ describes the mask pattern of the photomask being inspected.

$\lambda_i$ and $E_i$ refer, respectively, to the Eigen Vectors and Eigen Values of associated elements of a transmission cross-coefficient (TCC) imaging matrix associated with the inspection tool.

And wherein $\otimes$ describes a convolution operation.

We define convolution in one dimension as $$f \otimes g = \int_{-\infty}^{\infty} f(\tau) g(t - \tau) d\tau = \int_{-\infty}^{\infty} g(\tau) f(t - \tau) d\tau.$$

The Eigen Vectors are normalized, such that $\iint \|E_i(x,y,z)\|^2 dxdy = 1$. The Eigen Values meet the condition, $$\sum_{i=0}^{N} \lambda_i = 1.$$

The intensity point spread function ($PSF_I$) is the response of this partially coherent optical system to a delta function or an extremely small object. It is $$PSF_I(x, y, z) = \sum_{i=0}^{N} \lambda_i(z) \cdot \|E_i(x, y, z)\|^2$$

A great advantage of using the Eigen vector method is that relatively few Eigen vectors are needed for reasonable accuracy. Typically for inspection applications, the number of Eigen vectors is in the range of 3 to 11.

In Equation 1 we assume that the mask does not have a defective area. If there is an area containing a defect, then we modify Equation 1 to:

$$I_T(x, y, z) = \sum_{i=0}^{N} \lambda_i(z) \|[\{c_T + a_T \cdot P(x, y)\} + D(x, y)] \otimes E_i(x, y, z)\|^2 \quad [\text{Eqn. 2}]$$

Where $D(x,y)$ is the defective area complex amplitude contrast to either the background or foreground tone, depending on its location. Our objective is to obtain the complex amplitude contrast $D(x,y)$ by analyzing image changes at different z values.

Assuming that the inspection and lithography wavelengths are the same, in this case $c_T$ and $a_T$ are real functions because of lithography mask design. $P(x,y)$ is a real binary function. At focus (z=0), $E_i(x,y,0)$ is also real.

Expanding Equation 2

$$I_T(x, y, z) = \|c_T\|^2 \sum_{i=0}^{N} \lambda_i(z) \|W_i(z)\|^2 + \quad [\text{Eqn. 3}]$$

$$\|a_T\|^2 \sum_{i=0}^{N} \lambda_i(z) \|P(x, y) \otimes E_i(x, y, z)\|^2 +$$

$$\ldots \sum_{i=0}^{N} \lambda_i(z) \|D(x, y) \otimes E_i(x, y, z)\|^2 +$$

$$\ldots 2 a_T c_T \sum_{i=0}^{N} \lambda_i(z) \text{Re}(W_i(z) * P(x, y) \otimes E_i(x, y, z)] +$$

$$\ldots 2 c_T \sum_{i=0}^{N} \lambda_i(z) \text{Re}(W_i(z) * [D(x, y) \otimes E_i(x, y, z)]) + \ldots 2 a_T$$

$$\sum_{i=0}^{N} \lambda_i(z) \text{Re}([P(x, y) \otimes E_i^*(x, y, z)] \cdot [D(x, y) \otimes E_i(x, y, z)])$$

where $W_i(z)$ is the (x,y) integrated value of $E_i(x,y,z)$. Only eigenvectors with no mirror planes through the origin will have non-zero $W_i$, while all others integrate to zero. Note that the intensity can be normalized to one for a completely transmissive object. Thus, $I_T(x,y,z)$ can be divided by $$\sum_{i=0}^{N} \lambda_i(z) \|W_i(z)\|^2$$

to obtain such normalization.

The first three terms in Equation 3 are the intensities of the individual patterns taken independently. The background tone $\|c_T\|^2$ is simply an intensity offset. The pattern-dependent intensity in the second term is positive definite. This leads to an interesting observation. If the background tone is defined as due to transmission through quartz, then $c_T$ is equal to one. The foreground tone may be defined as embedded phase shift material (EPSM). At a typical lithographic wavelength, it has typically an amplitude of approximately −0.25. Thus $a_T$ is −1.25. As a result, the term on the third line of Eqn. 3 contributes negatively to the resultant intensity.

What is being obtained for the lithography simulations is the complex defect function, $D(x,y) = D_R(x,y) + iD_I(x,y)$, wherein the subscripts R and I refer to the real and imaginary parts of the defect amplitude function. An equivalent representation of $D(x,y)=M_D(x,y)=_D(x,y)\cdot e^{i\phi_D(x,y)}$ wherein $M_D$ and $\phi_D$ are the magnitude and phase, respectively, of the defect contrast.

At focus $E_i(x,y,z)$ and $W_i(z)$ are real, thus only the real part of $D(x,y)$ mixes with the defect-free pattern. However, the imaginary part of $D(x,y)$ is present in the quadratic term.

At focus (z=0), Equation 4 reduces to:

$$I_T(x, y, z) = \|c_T\|^2 \sum_{i=0}^{N} \lambda_i(z)W_i(0)^2 + \|a_T\|^2 \sum_{i=0}^{N} \lambda_i(0)[P(x, y) \otimes E_i(x, y, 0)]^2 +$$

$$\dots \sum_{i=0}^{N} \lambda_i(0)\{[D_R(x, y) \otimes E_i(x, y, 0)]^2 + [D_I(x, y) \otimes E_i(x, y, 0)]^2\} +$$

$$\dots 2a_T c_T \sum_{i=0}^{N} \lambda_i(0)\{w_i(0)[P(x, y) \otimes E_i(x, y, 0)]\} +$$

$$\dots 2c_T \sum_{i=0}^{N} \lambda_i(0)\{W_i(0)[D_R(x, y) \otimes E_i(x, y, 0)]\} +$$

$$\dots 2a_T \sum_{i=0}^{N} \lambda_i(0)\{[P(x, y) \otimes E_i(x, y, 0)] \cdot [D_R(x, y) \otimes E_i(x, y, 0)]\}$$

Note that there are two sets of defect convolutions, one for the real part and one for the imaginary part of $D(x,y)$, which reduce to one set if the ratio between the real and imaginary parts of $D(x,y)$ is a constant (i.e., constant defect phase).

When the object is out of focus, the $E_i(x,y,z)$ become complex and the imaginary part of $D(x,y)$ now mixes with the pattern. The imaginary part of $E_i(x,y,z)$ fulfills the following condition, $$E_i^*(x,y,-z)=E_i(x,y,z)$$

or $$E_i^*(x,y,z)=E_i(x,y,-z)$$

In addition, the following conditions on $\lambda_i$ and $W_i$ obtain.

$$\lambda_i(-z)=\lambda_i(z)$$

$$W_i^*(-z)=W_i(z)$$

or $$W_i^*(z)=W_i(-z)$$

Expanding Equation 2 out and using the above conditions, it is noted that there are odd and even symmetric terms of $I_T(x,y,z)$ around z=0.

$$I_T(x, y, z) = \|c_T\|^2 \sum_{i=0}^{N} \lambda_i(z)W_i(-z)W_i(z) + \dots \|a_T\|^2 \quad \text{[Eqn. 4]}$$

$$\sum_{i=0}^{N} \lambda_i(z)[P(x, y) \otimes E_i(x, y, -z)] \cdot [P(x, y) \otimes E_i(x, y, z)] + \dots$$

$$\sum_{i=0}^{N} \lambda_i(z)$$

$$\left\{ \begin{array}{l} [D_R(x, y) \otimes E_i(x, y, -z)] \cdot [D_R(x, y) \otimes E_i(x, y, z)] + \\ [D_I(x, y) \otimes E_i(x, y, -z)] \cdot [D_I(x, y) \otimes E_i(x, y, z)] \end{array} \right\}$$

-continued $$+ \dots i \sum_{i=0}^{N} \lambda_i(z)$$

$$\left\{ \begin{array}{l} [D_R(x, y) \otimes E_i(x, y, -z)] \cdot [D_I(x, y) \otimes E_i(x, y, z)] - \\ [D_I(x, y) \otimes E_i(x, y, -z)] \cdot [D_R(x, y) \otimes E_i(x, y, z)] \end{array} \right\}$$

$$+ \dots 2a_T c_T$$

$$\sum_{i=0}^{N} \lambda_i(z)\frac{1}{2} \left\{ \begin{array}{l} W_i(z)[P(x, y) \otimes E_i(x, y, -z)] + \\ W_i(-z)[P(x, y) \otimes E_i(x, y, z)] \end{array} \right\} +$$

$$\dots 2c_T \sum_{i=0}^{N} \lambda_i(z)\frac{1}{2} \left\{ \begin{array}{l} W_i(z)[D_R(x, y) \otimes E_i(x, y, -z)] + \\ W_i(-z)[D_R(x, y) \otimes E_i(x, y, z)] \end{array} \right\} +$$

$$\dots i2c_T \sum_{i=0}^{N} \lambda_i(z)\frac{1}{2} \left\{ \begin{array}{l} W_i(-z)[D_I(x, y) \otimes E_i(x, y, z)] - \\ W_i(z)[D_I(x, y) \otimes E_i(x, y, -z)] \end{array} \right\} +$$

$$\dots 2a_T \sum_{i=0}^{N} \lambda_i(z)\frac{1}{2}$$

$$\left\{ \begin{array}{l} [P(x, y) \otimes E_i(x, y, -z)] \cdot [D_R(x, y) \otimes E_i(x, y, z)] + \\ [P(x, y) \otimes E_i(x, y, z)] \cdot [D_R(x, y) \otimes E_i(x, y, -z)] \end{array} \right\} +$$

$$\dots i2a_T \sum_{i=0}^{N} \lambda_i(z)\frac{1}{2}$$

$$\left\{ \begin{array}{l} [P(x, y) \otimes E_i(x, y, -z)] \cdot [D_I(x, y) \otimes E_i(x, y, z)] - \\ [P(x, y) \otimes E_i(x, y, z)] \cdot [D_I(x, y) \otimes E_i(x, y, -z)] \end{array} \right\}$$

The terms that are even under the $z \rightarrow -z$ inversion through focus are all those without i in front of them and the odd ones have i. At focus all of the odd terms are zero. If we have two images at $\pm\Delta$, then the sum or average image $$\frac{[I_T(x, y, \Delta) + I_T(x, y, -\Delta)]}{2},$$

contains only the even terms and the difference image, $I_T(x, y, \Delta) - I_T(x, y, -\Delta)$, contains only the odd terms.

Regarding the defect function, there are a couple of special cases of interest. One is a constant defect phase and varying magnitude, in which case we only have to calculate one set of convolutions because the ratio between the real and imaginary parts of the defect function is a constant. Another is to have the defect function be a pure real or a pure imaginary function.

The method by which we obtain the real and imaginary parts of the defect amplitude function will now be explained. The difference image has three terms in Equation 4 (terms with i in front). The last two are terms are linear in $D_i(x,y)$. Thus, as we know the characteristics of the optical system (the $\lambda_i$, $E_i$ and $W_i$) by design and measurement and the convolution of $P(x,y)$ from the sum image or the database, we have a linear term in $D_i(x,y)$ convolved with known functions. However, we have the quadratic term which mixes the real and imaginary parts of the defect amplitude function. If the defect has a constant phase, i.e., $\phi(x,y)=$constant, then the quadratic term is zero. Otherwise, we use a starting value of $D_i(x,y)$, assuming the quadratic term is zero, in an iteration of the real and imaginary defect function in the sum and difference images to minimize the difference between the calculated value and the measurement defect images.

The focus offset may be obtained by setting a focus offset in any of the above described systems. Typically, an inspection system will include mechanisms for maintaining a selected focus setting for each image, such as an optimum focus or an offset from optimum focus. The Eigen Vectors and Eigen Values, as described above, vary with the focus position of the optics. At focus the eigenvectors are real; with defocus the eigenvectors become complex, with the imaginary part approximately linearly proportional to the amount of defocus (z) and with the sign of z. Additionally, the Eigen Values have an approximately quadratic dependence on z. The real parts of the Eigen Values have an approximate quadratic dependence on z. Accordingly, two images are captured at a known focus difference (e.g., $2\Delta$). Given the information available in the two images and the known $\Delta$, we can approximately separate the real and imaginary parts of the mask defect amplitude transmission function.

If we have two images, one on the positive side of focus and one on the negative side, combining the two into a sum image and a difference image will separate the real (sum) and imaginary (difference) parts of the mask transmittance. In some systems, it may be difficult to keep the system at this focus condition. Thus, mechanisms may be provided for compensating or adjusting the images. In one implementation, the average focus position between the two images is first determined. The two images are then corrected so as to obtain two modified images corresponding to focus or z value=$\pm\Delta$. The sum and difference images may then be analyzed as described herein to obtain the real and imaginary parts of the mask defect amplitude transmission function.

Once the mask defect amplitude transmission function D(x,y) has been recovered (Step 204), it can be input into a properly adjusted model of the lithography system that would be used to print patterns from the mask (Step 206). The imaging model of lithography system (e.g., a stepper or scanner system) is similar to that introduced in Equation 1

$$I_{S_T}(x, y) = \sum_{i=0}^{N} \lambda_{S_i} \|[c_S + a_S \cdot P(x, y)] \oplus E_{S_i}(x, y)\|^2 \quad \text{Eqn. 5}$$

Wherein P(x,y) defines the pattern on the photomask.

Where $I_{S_t}(x,y)$ describes the transmitted intensity image of a mask using the lithography tool optical parameters (e.g., stepper system S parameters).

Wherein $c_s$ is the complex transmitted amplitude of the background tone of the mask and $a_s$ is the complex transmitted amplitude of the difference between the mask foreground tone and the background tone.

$E_{S_i}$, $\lambda_{S_i}$, refer, respectively, to the Eigen Vectors and Eigen Values of associated elements of a transmission cross-coefficient (TCC) imaging matrix associated with the lithography tool (S).

We do have the pattern P(x,y) of the photomask and have the mask defect transmission function D(x,y). The model (Equation 5) can be adapted to accommodate this mask defect transmission function. This adaptation is described below.

$$I_{S_T}(x, y) = \sum_{i=0}^{N} \lambda_{S_i} \|[c_S + a_S \cdot P(x, y) + D(x, y)] \oplus F_i(x, y)\|^2 \quad \text{Eqn. 6}$$

Where D(x,y) is the mask defect transmission function described above in Equation 2 and the supporting explanatory paragraphs. $F_i(x,y)$ defines a set of modified coherent bases that enable processing of the pattern and the defect in the stepper model of Equation 4.

The TCC matrix for the stepper may involve many terms. However, because most of the energy is represented by the first few terms, accurate estimates can be obtained using only those terms (e.g., the first ten or so terms). Thus, if desired, a truncated model can be employed that significantly reduces the computational burden. In any case, the inspector can obtain what ever degree of accuracy is desired by taking as many terms in the series as are needed to attain the desired level of accuracy. By processing the mask defect transmission function through the modified stepper model of Equation 6, an aerial image is obtained that models the stepper behavior very well. As mentioned earlier this software model is easily adapted to any configuration of any stepper and has no problem modeling the high-NA effects that occur at the wafer plane.

The aerial image is then processed using a photoresist model that models the behavior of the photoresist used on the wafer (or other such imaged substrate) to obtain a pattern as it is to be formed on the substrate surface (Step 206). This can be compared with a reference to determine the presence of lithographically significant defects (Step 208). Such lithographically significant defects are those that are distinct from "nuisance defects" which have little or no effect on the printed pattern.

As such, for the purposes of this disclosure, lithographically significant defects are those defects having lithographic significance in the final printed pattern. That is to say, some defects ("nuisance defects"), although present in the mask, have no significant impact on the printed pattern transferred to a photoresist layer. Significant reticle defects can be defined as a defect that is determined to be printable in a photoresist layer of the calculated the wafer and/or within an area of the photoresist layer that has a device density over a predetermined value. Examples include, defects so small (or on a lithographically insensitive portion of the pattern) as to be largely irrelevant. Also, a defect can be formed in a relatively defect insensitive portion of the substrate. In some cases a defect can be formed on an assist or OPC feature (or other resolution enhancement feature) but be of such character that it does not affect the final printed pattern. Thus, a lithographically significant defect is a defect that is present on the mask and can cause a significant effect in the lithographically transferred pattern. Such lithographically significant defects can cause problems related to circuit failures, sub optimal performance, and so on.

In one embodiment the detection of lithographically significant defects is done in a die-to-database mode. In this mode, the resist image obtained in the process above is compared to a database rendered image of what is expected in the resist image. Such a database rendered image is produced by processing the database pattern through mask writing and etching models to obtain the reference mask pattern. This reference mask pattern is then propagated through the stepper (or scanner) model to produce the reference aerial image. The reference aerial image is then further processed through the resist model to form the reference resist image. This reference image is aligned with the resist image under test and the two images are compared. This comparison can be repeated using different lithography modeling parameters to simulate various focus and exposure conditions that span the extremes of the intended process window. If the test and reference resist images differ significantly during any of the comparisons, defects are flagged. Thus, the present embodiments disclose methods for determining how the actual mask performs relative to the expected performance over the process window.

In another embodiment, the detection of lithographically significant defects is done in a die-to-die mode. In this mode, the resist image to be tested is compared with a second such image obtained from a second site on the photomask that is intended to contain an identical pattern. Such an inspection can be used when the photomask is for instance a two-die (or more) reticle. As with die-to-database comparison, this comparison can be repeated using different lithography modeling parameters to simulate various focus and exposure conditions that span the extremes of the intended process window.

The techniques of the present invention may be implemented in any suitable combination of software and/or hardware system. Regardless of the system's configuration, it may employ one or more processors for controlling various components of the system and analyzing output images and signals detected with such system. The system also includes one or more memories or memory modules configured to store data, program instructions for the general-purpose inspection operations and/or the inventive techniques described herein. The program instructions may control the operation of an operating system and/or one or more applications, for example. The memory or memories may also be configured to store layout patterns, layout constraint rules and target rules.

Because such information and program instructions may be employed to implement the systems/methods described herein, the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in a carrier wave traveling over an appropriate medium such as air, optical lines, electric lines, etc. Examples of program instructions include both machine code, such as produced by a compiler, and files containing higher level code that may be executed by the computer using an interpreter.

Although the foregoing invention has been described in some detail for purposes of clarity of understanding, it will be apparent that certain changes and modifications may be practiced within the scope of the appended claims. For example, although the above described techniques are described as being applied to each defect found during a reticle inspection, of course, the inventive techniques may also be applied to any sample of found reticle defects. Therefore, the described embodiments should be taken as illustrative and not restrictive, and the invention should not be limited to the details given herein but should be defined by the following claims and their full scope of equivalents.

What is claimed is:

1. A method of determining lithographically significant reticle defects, comprising:
    inspecting a reticle to find reticle defects;
    obtaining a mask transmission function for each reticle defect, wherein the mask transmission function for each reticle defect is obtained from at least two images of each reticle defect, wherein a constant focus offset was maintained between the focus settings of the at least two images;
    inputting the obtained mask transmission function for each reticle defect into simulation software and/or hardware to calculate a defect-affected pattern in the developed photo-resist of a wafer that would be fabricated with a lithographic tool using the reticle; and
    determining whether there are any lithographically significant reticle defects based on the defect-affected pattern that was calculated for each reticle defect.

2. A method as recited in claim 1, wherein the constant focus offset was maintained between the focus settings of the at least two images during acquisition of such at least two images.

3. A method as recited in claim 1, wherein the constant focus offset was maintained between the focus settings of the at least two images while the average focus of the two images varies.

4. A method as recited in claim 1, wherein obtaining the mask transmission function for each defect comprises:
    obtaining at least two test images of the each defect's area so that the test images have a constant focus offset between each other;
    obtaining at least two references images of another reticle area that corresponds to the each defect's area so that the reference images have a constant focus offset between each other, or calculating the at least two reference images having a constant focus offset from a database used to manufacture the reticle;
    subtracting each set of test and reference images that was obtained at a same focus to obtain two difference images;
    summing the two difference images to obtain a summed image;
    subtracting the two difference images to obtain a differenced image; and
    analyzing the resultant summed and differenced images for each defect to determine real and imaginary components of the mask transmission function for each defect.

5. A method as recited in claim 4, wherein the at least two test images consist of a pair of test images and the at least two reference images consist of a pair of reference images.

6. A method as recited in claim 1, wherein the at least two images of each reticle defect are obtained from at least two detectors or sensors that are positioned so as to achieve the constant focus offset between the at least two images.

7. A method as recited in claim 1, wherein the at least two images of each reticle defect are obtained sequentially on two different areas of a same detector.

8. A method as recited in claim 1, wherein the constant focus offset is achieved by (i) a focus setting, for a first image of the each reticle defect, of $+\Delta$ relative to an optimum focus and (ii) a focus setting, for a second image of the same each reticle defect, of $-\Delta$ relative to the optimum focus, wherein the optimum focus has a focus setting equal to 0.

9. A method as recited in claim 1, wherein the constant focus offset is achieved by (i) a focus setting, for a first image of the each reticle defect, equal to an optimum focus and (ii)

a focus setting, for a second image of the same each reticle defect, of 2Δ relative to the optimum focus.

10. A method as recited in claim 1, wherein the simulation software and/or hardware includes a lithographic tool model that calculates an aerial image that would be produced by a particular lithographic tool based on the mask transmission function and includes a photoresist model for then calculating the defect-affected pattern based on the aerial image.

11. A method as recited in claim 1, wherein a lithographically significant reticle defect is defined as a reticle defect that is determined to be printable in a photoresist layer of the wafer and/or within an area of the photoresist layer that has a device density over a predetermined value based on the calculated defect-assisted pattern.

12. An apparatus for determining lithographically significant reticle defects, comprising:
one or more processors;
one or more memory, wherein at least one of the processors and memory are adapted for:
inspecting a reticle to find reticle defects;
obtaining a mask transmission function for each reticle defect, wherein the mask transmission function for each reticle defect is obtained from at least two images of each reticle defect, wherein a constant focus offset was maintained between the focus settings of the at least two images;
inputting the obtained mask transmission function for each reticle defect into simulation software and/or hardware to calculate a defect-affected pattern in the developed photo-resist of a wafer that would be fabricated with a lithographic tool using the reticle; and
determining whether there are any lithographically significant reticle defects based on the defect-affected pattern that was calculated for each reticle defect.

13. An apparatus as recited in claim 12, wherein the constant focus offset was maintained between the focus settings of the at least two images during acquisition of such at least two images.

14. An apparatus as recited in claim 12, wherein the constant focus offset was maintained between the focus settings of the at least two images while the average focus of the two images varies.

15. An apparatus as recited in claim 12, wherein obtaining the mask transmission function for each defect comprises:
obtaining at least two test images of the each defect's area so that the test images have a constant focus offset between each other;
obtaining at least two references images of another reticle area that corresponds to the each defect's area so that the reference images have a constant focus offset between each other, or calculating the at least two reference images having a constant focus offset from a database used to manufacture the reticle;
subtracting each set of test and reference images that was obtained at a same focus to obtain two difference images;
summing the two difference images to obtain a summed image;
subtracting the two difference images to obtain a differenced image; and analyzing the resultant summed and differenced images for each defect to determine real and imaginary components of the mask transmission function for each defect.

16. An apparatus as recited in claim 15, wherein the at least two test images consist of a pair of test images and the at least two reference images consist of a pair of reference images.

17. An apparatus as recited in claim 12, wherein the at least two images of each reticle defect are obtained from at least two detectors or sensors that are positioned so as to achieve the constant focus offset between the at least two images.

18. An apparatus as recited in claim 12, wherein the at least two images of each reticle defect are obtained sequentially on two different areas of a same detector.

19. An apparatus as recited in claim 12, wherein the constant focus offset is achieved by (i) a focus setting, for a first image of the each reticle defect, of +z relative to an optimum focus and (ii) a focus setting, for a second image of the same each reticle defect, of −z relative to the optimum focus, wherein the optimum focus has a focus setting equal to 0.

20. An apparatus as recited in claim 12, wherein the constant focus offset is achieved by (i) a focus setting, for a first image of the each reticle defect, equal to an optimum focus and (ii) a focus setting, for a second image of the same each reticle defect, of 2Δ relative to the optimum focus.

21. An apparatus as recited in claim 12, wherein the simulation software and/or hardware includes a lithographic tool model that calculates an aerial image that would be produced by a particular lithographic tool based on the mask transmission function and includes a photoresist model for then calculating the defect-affected pattern based on the aerial image.

22. An apparatus as recited in claim 12, wherein a lithographically significant reticle defect is defined as a reticle defect that is determined to be printable in a photoresist layer of the wafer and/or within an area of the photoresist layer that has a device density over a predetermined value based on the calculated defect-assisted pattern.

23. A method for generating a reticle transmission function for a defect image, comprising:
providing a reticle configured to achieve lithographic transfer of a reticle pattern onto a substrate using a lithography system, wherein the reticle includes at least one defect area;
illuminating the defect area of the reticle;
capturing a first transmission intensity image of the illuminated defect area reticle at a first focus setting;
capturing a second transmission intensity image of the illuminated defect area reticle at a second focus setting, wherein a constant focus offset is maintained between the first and second focus settings or such a constant focus offset is emulated by adjusting the captured first and second transmission images; and
processing the first and second transmission intensity images together to recover and store a reticle transmission function for the defect area such that quadratic terms of the function cancel each other out leaving a linear function characterized by the mask pattern convolved with a recovery kernel.

* * * * *